United States Patent [19]

Radice

[11] Patent Number: 4,633,122
[45] Date of Patent: Dec. 30, 1986

[54] MEANS FOR ELECTRICALLY CONNECTING ELECTRODES ON DIFFERENT SURFACES OF PIEZOELECTRIC POLYMERIC FILMS

[75] Inventor: Peter F. Radice, King of Prussia, Pa.

[73] Assignee: Pennwalt Corporation, Philadelphia, Pa.

[21] Appl. No.: 745,986

[22] Filed: Jun. 18, 1985

[51] Int. Cl.[4] .......................................... H01L 41/08
[52] U.S. Cl. ................................. 310/339; 310/338; 310/363; 310/365; 310/800
[58] Field of Search ...................... 310/800, 363–366

[56] References Cited

U.S. PATENT DOCUMENTS

| | | | |
|---|---|---|---|
| 2,472,179 | 6/1949 | Tibbetts | 310/366 X |
| 2,479,926 | 8/1949 | Gravley | 310/366 X |
| 3,390,287 | 6/1968 | Sonderegger | 310/366 X |
| 3,408,515 | 10/1968 | Morse | 310/366 X |
| 3,816,774 | 6/1974 | Ohnuki et al. | 310/800 X |
| 4,056,742 | 11/1977 | Tibbetts | 310/800 X |
| 4,166,229 | 8/1979 | De Reggi et al. | 310/800 X |
| 4,424,465 | 1/1984 | Ohigashi et al. | 310/800 X |
| 4,501,319 | 2/1985 | Edelman et al. | 310/800 X |
| 4,549,107 | 10/1985 | Kaneko et al. | 310/800 X |

*Primary Examiner*—Mark O. Budd

[57] ABSTRACT

Electrodes with leads deposited on different surfaces of a piezoelectric polymeric film or films are easily and quickly electrically connected by forming a continuous channel through the film and lead to form a pierced lead, and then applying an electrically conductive material, by any one of several known processes, onto the film over the channel to thereby form a connecting lead, the conductive material being permitted to penetrate the channel to effect a continuity of conductive material between the pierced lead and connecting lead.

10 Claims, 7 Drawing Figures

MEANS FOR ELECTRICALLY CONNECTING ELECTRODES ON DIFFERENT SURFACES OF PIEZOELECTRIC POLYMERIC FILMS

STATEMENT OF THE INVENTION

This invention relates to piezoelectric transducers and more particularly to transducers employing polymeric film as the piezoelectric element wherein an electrode on one surface of the film is quickly and easily electrically connected to an electrode on the opposite surface of the film or to an electrode deposited on a surface of another film, or to allow an electrical connection to be made to the opposite surface of the film.

BACKGROUND AND SUMMARY OF THE INVENTION

In the vast area of piezo film applications, it is necessary to have a means of detecting the charge or voltage produced by a piezo or pyro event. An electrode is needed on each side of the film for any application. Most such applications require the electrodes on opposite surfaces of the film to be electrically isolated from each other. Thus, care must be observed when depositing the electrodes on film surfaces to insure that metal migration does not occur over the edges of the film to result in possible shorting out of the electrodes. It is sometimes necessary however to electrically connect an electrode on one film surface with an electrode on the opposing film surface or to an electrode on the surface of another film to control capacitance or impedance; to effect common electrical connection; to move a conductor from one film surface to another surface; to permit ease of lead attachment for termination, and the like.

The present invention provides a facile and convenient method for electrically connecting electrodes on opposing surfaces of a piezoelectric film by forming at least one hole or channel through the film as well as the lead to be electrically connected or linked to another surface. The hole may be formed by pin, punch, or laser, for example. Then, by depositing conductive ink over the hole by silk-screening, for example, a portion of the ink will adhere to the hole sidewalls while penetrating the hole to effect the electrical connection with the pierced electrode.

If it is desired to electrically move an electrode from the surface of one film to the surface of another film, it is only necessary to align the films, pierce the film whose surface is to be linked to the already deposited electrode, and silk-screen conductive ink over the pierced hole or channel.

The invention is not intended to be limited to silk-screening processes for depositing a conductive ink over the hole, but may employ electrostatic printing and xerography techniques, spraying, painting, ink jet printing, carbon particle deposition, and the like.

DETAILED DESCRIPTION OF THE INVENTION

Figure 1:
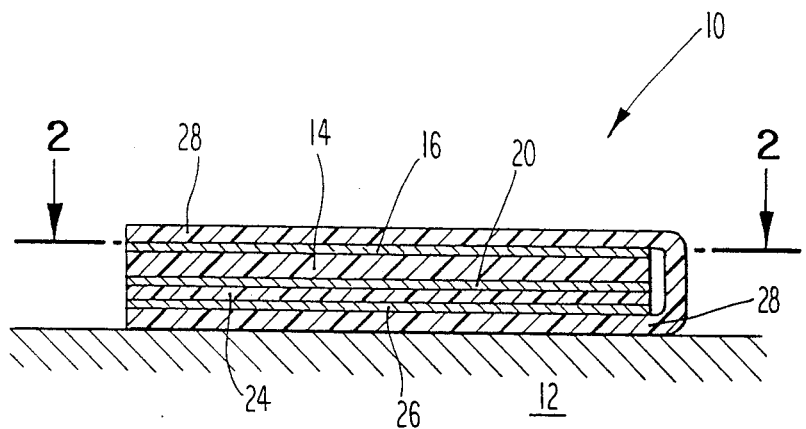
FIG. 1 is a sectional view through a piezoelectric acoustic or vibration pick-up transducing device employing the "plated-through-hole" technique of the present invention.
Figure 2:
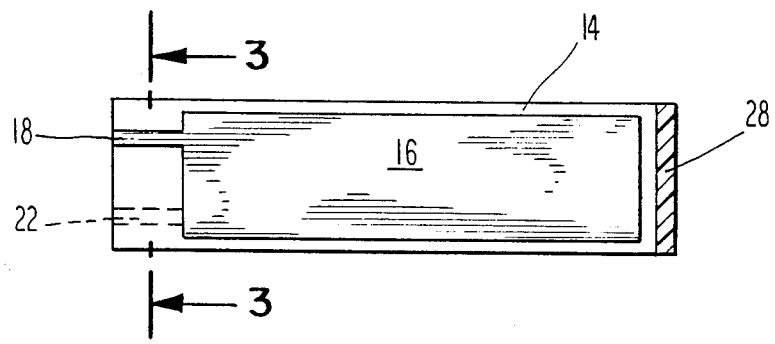
FIG. 2 is a sectional view of FIG. 1 looking in the direction of arrows 2—2.
Figure 3:
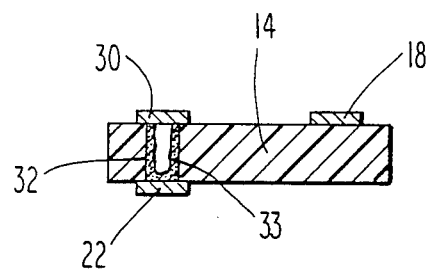
FIG. 3 is a sectional view of a portion of FIG. 2 taken along line 3—3 thereof and including a plated-through-hole and resultant electrical connection made in accordance with the present invention.

Referring to FIGS. 1, 2 and 3, a piezoelectric acoustic or vibration pick-up transducing device 10 is affixed to a guitar 12, for example, in vibration receiving relationship. Vibration pick-up 10 comprises a piezoelectric polymeric film 14, typically Kynar ®, a polyvinylidene fluoride (PVDF) product of Pennwalt Corporation, Philadelphia, Pa., assignee of the present invention. The piezoelectric film 14 is provided with a ground electrode 16 and termination lead 18, both simultaneously deposited on an upper surface of the film, and a signal generating or detecting electrode 20 with termination lead 22 deposited on its lower surface. The electrodes 16 and 20 are deposited in substantial superposed relationship, unlike leads 18 and 22 which are staggered. An insulating film or sheet 24, typically Mylar, a polyethylene terephthalate resin film product of duPont, separates the signal generating electrode 20 from a grounding shield 26. A plastic protection laminate 28 embraces pick-up 10 except at its front end, i.e., where termination leads 18 and 22 extend.

Ground electrode 16, signal generating electrode 20, and leads 18 and 22 are preferably deposited on film 14 by a silk-screening process. The silk-screening conductive ink comprises a finely divided electrically conductive metal, suitably silver, nickel or copper, embedded within a polymer matrix. Shield 26 may be deposited on the undersurface of insulating sheet 24 by a silk-screening process, or by an electroplating process, vacuum deposition by evaporation or sputtering, and the like. Shield 26 insures against spurious voltages or radiation being picked up by acoustic transducer 10.

The laminated acoustic pick-up 10 may have a total thickness of about 6 to 8 mils. Thickness of piezoelectric film 14 may range between $6\mu$ to $110\mu$, and preferably 20 to $50\mu$. The insulating film 24 thickness may range between about 6 to $25\mu$ while the electrodes 16 and 20 and shield 26 thicknesses will typically be about $6-8\mu$.

In order to facilitate connections to be made to leads 18 and 22, i.e., to permit connections to be readily made on the same film surface, reference is made to FIGS. 2 and 3 of the drawings wherein an electrically linking or connecting electrode 30 is formed on the upper surface of film 14, as is ground electrode 16 and lead 18. Linking electrode 30 is caused to become electrically connected to signal generating electrode 20 (FIG. 1) deposited on the lower surface of piezoelectric film 14. To that end, a hole or channel 32, typically a pin hole or punched-out hole, is provided through film 14 and lead 22. Linking electrode 30 is then formed over channel 32 by depositing or applying conductive ink 33 thereon by silk-screening, or spraying, painting, and the like.

More specifically, by silk-screening, spraying or printing, the linking electrode 30 on the film, a portion of the conductive ink or material 33 will penetrate hole 32 to contact lead 22 to fill, or partially fill hole 32, or at least to coat the walls thereof to thereby form an electrical connection between the signal generating electrode 20 on the lower surface of film 14 and the linking electrode 30 formed on the film's upper surface.

The invention may be practiced by forming a plurality of pin holes and the like in lieu of a single hole and then plating through the holes as abovedescribed. Larger hole sizes, i.e., those approaching ¼ inch in diameter, which expose more film 14 sidewall area than the area exposed by one or more pin holes result in electrical connections which are at least equally reliable to connections formed by the single pin hole method. Ground electrode 16 and shield 26 are led to ground (not shown) by conventional means.

Figure 4:
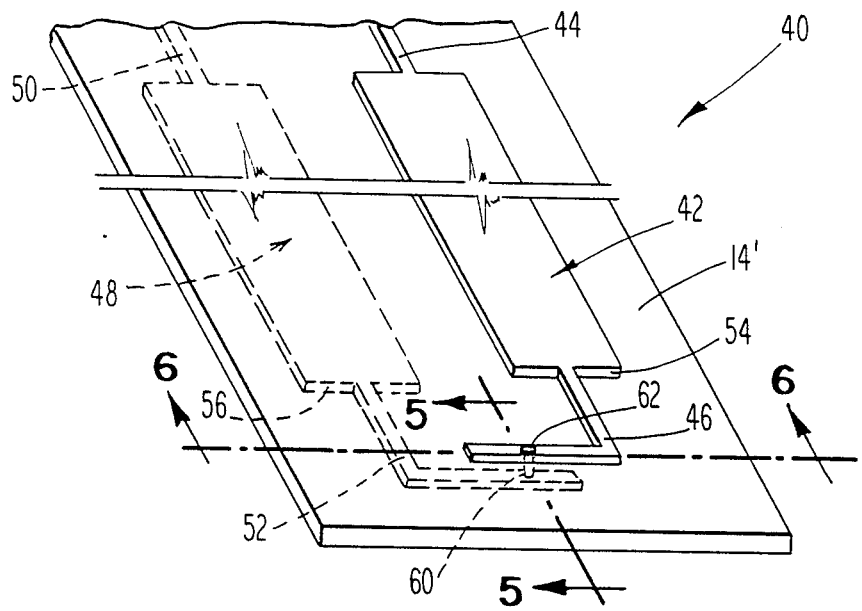
FIG. 4 is a perspective view, part in phantom, of a piezoelectric transducer employing the plated-through-hole technique of the present invention.
Figure 5:
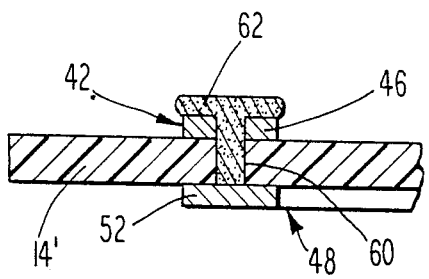
FIGS. 5 and 6 are sectional views of FIG. 4 taken along lines 5—5 and 6—6 respectively, including components resulting from practicing the plated-through-hole technique of the present invention
Figure 6:
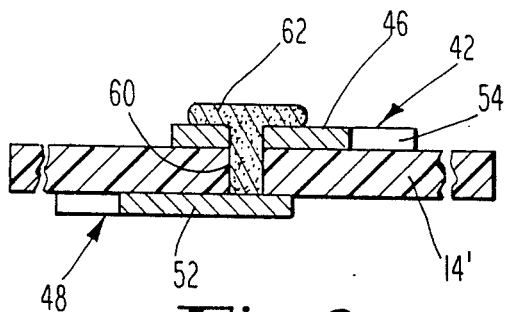

Referring now to FIG. 4 of the drawings, a piezoelectric transducer 40, such as an acoustic pick-up, includes an electrode deposited on each surface of a piezoelectric film, the electrodes being connected in series for controlling or matching impedance of the system. More specifically, transducer 40 includes a signal generating electrode 42 with termination lead 44 and connecting lead 46 deposited on an upper surface of piezoelectric film 14'. An identical electrode 48 with termination lead 50 and connecting lead 52 is deposited on the lower surface of film 14', shown by dotted lines. Electrodes 42 and 48 are deposited in staggered relationship and include shoulder portions 54 and 56 respectively. Connecting leads 46 and 52 are similarly staggered but turn inwardly in order that end portions of each become aligned and superimposed. Termination leads 44 and 50 may be brought to the same surface of film 14' by means described hereinabove.

A hole or channel 60 is provided through the end portions of connecting leads 46 and 52 as well as film 14', and a conductive ink 62 silk-screened, for example, over the upper signal generating electrode 42. Ink 62 penetrates hole 60 to contact electrode 48 on the lower surface of film 14' to effect a series connection between the electrodes. As mentioned above, ink 62 or suitable conductive material may be applied by spraying, painting, and the like, and may fill, partially fill, or only coat the walls of hole or channel 60 to thereby effect the desired electrical connection. Similarly, a plurality of holes 60 may be provided along the end portions of the connecting leads as aforementioned.

Figure 7:
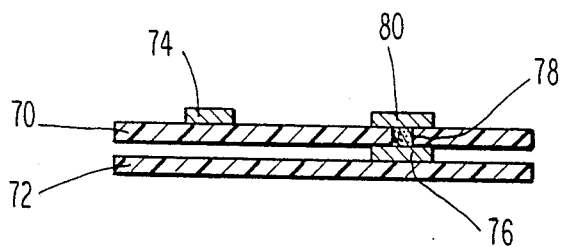
FIG. 7 is a view similar to FIG. 3 illustrating the electrical "moving" of an electrode from one film to the surface of another film.

In FIG. 7, PVDF films 70 and 72 have electrodes 74 and 76 deposited on upper surfaces thereof respectively and it is desired to electrically "move" electrode 76 to the same surface of film 70 as is electrode 74. A hole or channel 78 is provided in film 70 which may then be coated or filled with a conductive ink or electrode material 80.

While the preferred piezoelectric polymeric film is PVDF, films made from copolymers of vinylidene fluoride and copolymerizable comonomers of tetrafluoroethylene and trifluoroethylene, for example, may be used advantageously with the present invention.

I claim:

1. A piezoelectric transducer comprising
a piezoelectric polymer film,
a ground electrode with lead deposited on one surface of said film,
a signal generating electrode with lead deposited on other surface of said film, said leads being deposited in staggered relationship on said film and extending substantially parallel to each other in same direction,
means for facilitating electrical connections to said leads by electrically disposing said leads on same surface of said film, said means comprising,
said film having a channel provided therethrough, said channel piercing one of said leads to form a pierced lead,
conductive material affixed to said film over said channel to provide a linking lead on opposite surface of said film carrying said pierced lead, said conductive material coating sidewalls of said channel to effect continuity of said conductive material between said pierced lead and said linking lead,
said conductive material being resilient, durable and rubber-like and comprising a polymer matrix having a conductive metal embedded therein selected from the group consisting of silver, nickel and copper, said ground electrode with lead and said signal generating electrode with lead consisting of said conductive material, and
other means for connecting said leads on same surface of said film to electrical connectors.

2. A piezoelectric transducer comprising
a piezoelectric polymer film,
a signal generating electrode deposited on each surface of said film,
a lead attached to each of said signal generating electrodes, said leads having portions thereof in aligned superposed relationship,
means for electrically connecting said leads in series through said film,
means for facilitating electrical connections to said leads by electrically disposing said leads on same surface of said film, said means comprising,
said film having a channel piercing each of said aligned superposed leads to form pierced leads,
conductive material affixed to one of said pierced leads, said conductive material coating sidewalls of said channel to effect continuity of said conductive material between said pierced leads,
said conductive material being resilient, durable and rubber-like and comprising a polymer matrix having a conductive metal embedded therein selected from the group consiting silver, nickel and copper, said signal generating electrodes with leads consisting of said conductive material, and
other means for connecting each of said signal generating electrodes to electrical connectors.

3. A piezoelectric transducer comprising
a pair of piezoelectric polymer films, each of said pair of films having an electrode with lead deposited on one surface thereof,
means for electrically disposing said leads on same surface of one of said films comprising
one of said films having a channel provided therethrough which pierces lead on other of said pair of films to form a pierced lead,
conductive material affixed to said film over said channel to provide a connecting lead on same surface of said film carrying lead which remains unpierced, said conductive material coating sidewalls of said channel to effect continuity of said conductive material between said pierced lead and said connecting lead,
said conductive material being resilient, durable and rubber-like and comprising a polymer matrix having a conductive metal embedded therein selected from the group consisting of silver, nickel and copper, said electrodes with leads consisting of said conductive material.

4. Transducer of claim 1 wherein a plurality of channels is provided.

5. Transducer of claim 2 wherein a plurality of channels is provided.

6. Transducer of claim 3 wherein a plurality of channels is provided.

7. Transducer of claim 1 wherein said piezoelectric polymer film is selected from the group consisting of polyvinylidene fluoride, copolymers of vinylidene fluoride, and copolymerizable comonomers of tetrafluoroethylene and trifluoroethylene.

8. Transducer of claim 2 wherein said piezoelectric polymer film is selected from the group consisting of polyvinylidene fluoride, copolymers of vinylidene fluoride, and copolymerizable comonomers of tetrafluoroethylene and trifluoroethylene.

9. Transducer of claim 3 wherein said piezoelectric polymer film is selected from the group consisting of polyvinylidene fluoride, copolymers of vinylidene fluoride, and copolymerizable comonomers of tetrafluoroethylene and trifuloroethylene.

10. Transducer of claim 2 wherein said signal generating electrodes are deposited in non-aligned or staggered relationship.

* * * * *